United States Patent [19]
Hause et al.

[11] Patent Number: 5,885,887
[45] Date of Patent: Mar. 23, 1999

[54] METHOD OF MAKING AN IGFET WITH SELECTIVELY DOPED MULTILEVEL POLYSILICON GATE

[75] Inventors: Frederick N. Hause; Robert Dawson; H. Jim Fulford Jr., all of Austin; Mark I. Gardner, Cedar Creek; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 847,752

[22] Filed: Apr. 21, 1997

[51] Int. Cl.$^6$ .................................................. H01L 21/38
[52] U.S. Cl. ..................... 438/564; 438/558; 438/223; 438/232; 438/227
[58] Field of Search .................................. 438/217, 548, 438/549, 558, 564, 223, 232, 227, 322

[56] References Cited

U.S. PATENT DOCUMENTS

| | | | |
|---|---|---|---|
| 4,791,074 | 12/1988 | Tsunashima et al. | 438/549 |
| 5,304,504 | 4/1994 | Wei et al. | 438/303 |
| 5,407,839 | 4/1995 | Maruso | 438/217 |
| 5,457,060 | 10/1995 | Chang | 438/228 |
| 5,512,506 | 4/1996 | Chang et al. | 438/305 |
| 5,723,356 | 3/1998 | Tsukamoto | 438/564 |
| 5,770,490 | 6/1998 | Frenette | 438/564 |

*Primary Examiner*—Trung Dang
*Attorney, Agent, or Firm*—Skjerven, Morrill, MacPherson, Franklin, & Friel, L.L.P.

[57] ABSTRACT

A method of making an IGFET with a selectively doped multilevel polysilicon gate that includes upper and lower polysilicon gate levels is disclosed. The method includes providing a semiconductor substrate with an active region, forming a gate insulator on the active region, forming a a lower polysilicon layer on the gate insulator, forming a first masking layer over the lower polysilicon layer, etching the lower polysilicon layer through openings in the first masking layer using the first masking layer as an etch mask for a portion of the lower polysilicon layer that forms the lower polysilicon gate level over the active region, removing the first masking layer, forming the upper polysilicon gate level on the lower polysilicon gate level after removing the first masking layer, introducing a dopant into the upper polysilicon gate level without introducing the dopant into the substrate, diffusing the dopant from the upper polysilicon gate level into the lower polysilicon gate level, and forming a source and drain in the active region. Advantageously, the lower polysilicon gate level has both an accurately defined length to provide the desired channel length and a well-controlled doping concentration to provide the desired threshold voltage.

35 Claims, 7 Drawing Sheets

METHOD OF MAKING AN IGFET WITH SELECTIVELY DOPED MULTILEVEL POLYSILICON GATE

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a channel with zero gate voltage, and therefore are normally on. With N-channel depletion-mode devices a negative gate voltage is required to turn the devices off, and with P-channel depletion-mode devices a positive gate voltage is required to turn the devices off If the source and body of an IGFET are tied to ground, the threshold voltage can be calculated as follows:

$$V_T = \phi_{ms} - 2\phi_f - Q_{tot}/C_{ox} - Q_{BO}/C_{ox} - \Delta V_T \quad (1)$$

where $\phi_{ms}$ is the work-function difference between the gate material and the bulk silicon in the channel, $\phi_f$ is the equilibrium electrostatic potential in a semiconductor, $Q_{tot}$ is the total positive oxide charge per unit area at the interface between the oxide and the bulk silicon, $C_{ox}$ is the gate oxide capacitance per unit area, $Q_{BO}$ is the charge stored per unit area in the depletion region, and $\Delta V_T$ is a threshold lowering term associated with short-channel effects. Expressions have been established for these various quantities in terms of doping concentrations, physical constants, device structure dimensions, and temperature. For example, the work-function difference $\phi_{ms}$ varies as a function of the doping concentration in a polysilicon gate. Therefore, the threshold voltage depends on the doping concentration in the polysilicon gate.

Photolithography is frequently used to create patterns in photoresist that define where the polysilicon layer is etched to form the polysilicon gate. The photoresist has the primary functions of replicating an irradiated image pattern and protecting the underlying polysilicon when etching occurs.

Typically positive photoresist is used, the irradiated portions are rendered soluble to a subsequent developer, and the non-irradiated portions remain insoluble to the developer and provide the etch mask. Unfortunately, increasing the photoresist thickness generally decreases the accuracy in which the photoresist replicates the image pattern. Since, however, the photoresist is eroded by the etch, the photoresist must be thick enough to avoid being removed by the etch. The photoresist is often on the order of 4 times as thick as the underlying polysilicon to assure that the etch does not remove the photoresist.

For submicron geometries, the gate thickness is usually on the order of 2000 to 2500 angstroms so that during ion implantation of the source and drain, the gate provides an implant mask for the underlying channel region yet also receives sufficient doping to attain the desired threshold voltage. Unfortunately, the photoresist that defines the gate may have a thickness on the order of 8000 to 10,000 angstroms, which may be too large to accurately replicate the image pattern. Variations in photoresist linewidth can lead to variations in gate length ( the critical dimension), which in turn can lead to variations in channel length and ultimately device performance.

Accordingly, a need exists for an improved method of making an IGFET that provides an adequately doped polysilicon gate and reduces unwanted variations in gate length and device performance.

SUMMARY OF THE INVENTION

An object of the present invention is to provide an IGFET with a multilevel polysilicon gate that includes upper and lower polysilicon gate levels. The upper polysilicon gate level is formed on the lower polysilicon gate level, and a dopant in the upper polysilicon gate level is diffused into the lower polysilicon gate level. Advantageously, the lower polysilicon gate level can have a thickness of at most 1000 angstroms and can be formed using an ultra-thin photoresist layer that replicates an image pattern more accurately than thicker photoresist layers. In this manner, the lower polysilicon gate level can have an accurately defined length that provides a highly accurate implant mask for lightly doped source and drain regions, and receive the diffused dopant from the upper polysilicon gate level to have a well-controlled doping concentration that provides the desired threshold voltage.

In accordance with one aspect of the invention, a method of making an IGFET includes providing a semiconductor substrate with an active region, forming a gate insulator on the active region, forming a lower polysilicon layer on the gate insulator, forming a first masking layer over the lower polysilicon layer, etching the lower polysilicon layer through openings in the first masking layer using the first masking layer as an etch mask for a portion of the lower polysilicon layer that forms the lower polysilicon gate level over the active region, removing the first masking layer, forming the upper polysilicon gate level on the lower polysilicon gate level after removing the first masking layer, introducing a dopant into the upper polysilicon gate level without introducing the dopant into the substrate, diff using the dopant from the upper polysilicon gate level into the lower polysilicon gate level, and forming a source and drain in the active region.

In one embodiment, forming the upper polysilicon gate level includes depositing an upper polysilicon layer over the substrate wherein a portion of the upper polysilicon layer provides the upper polysilicon gate level, implanting the dopant into the upper polysilicon layer using the upper polysilicon layer as an implant mask, forming a second masking layer over the upper polysilicon layer after implanting the dopant into the upper polysilicon layer, etching the upper polysilicon layer through openings in the second masking layer using the second masking layer as an etch mask for the upper polysilicon gate level, and removing the second masking layer. Preferably, the first and second image patterns are essentially identical, the first and second masking layers are first and second photoresist layers, the second polysilicon layer is substantially thicker than the first polysilicon layer, and the second photoresist layer is substantially thicker than the first photoresist layer.

In this embodiment, lightly doped source and drain regions are implanted into the active region using the lower polysilicon gate level as an implant mask, and heavily doped source and drain regions are implanted into the active region using the upper polysilicon gate level and oxide spacers as an implant mask.

A feature of the invention is depositing an insulating layer over the substrate and on the lower polysilicon gate level after removing the first masking layer, polishing the insulating layer until a top surface of the lower polysilicon gate level is exposed, and then forming the upper polysilicon gate level.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
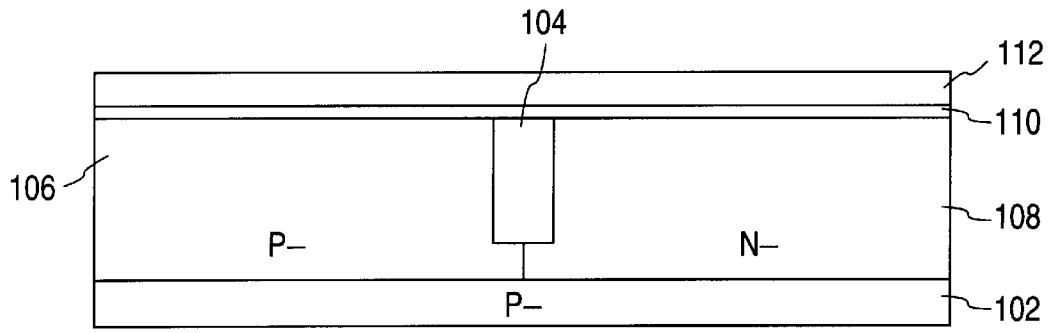
FIGS. 1A–1V show cross-sectional views of successive process steps for making an IGFET with a selectively doped multilevel polysilicon gate in accordance with an embodiment of the invention.

In the drawings, depicted elements are not necessarily drawn to scale and like or similar elements may be designated by the same reference numeral throughout the several views.

Figure 1B:
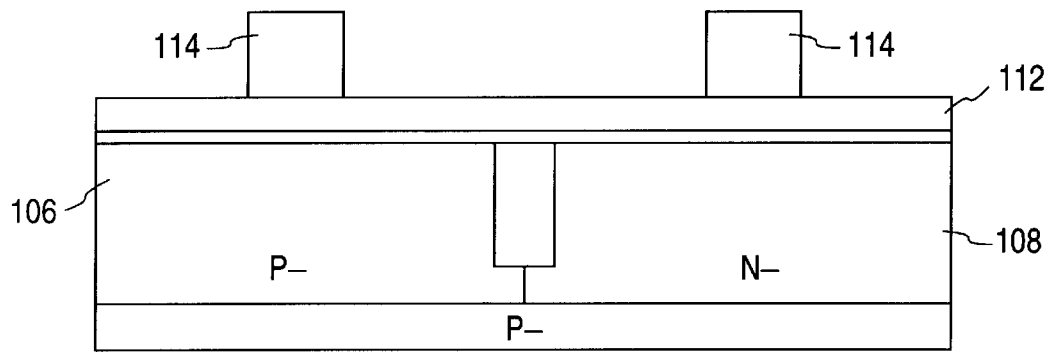
Figure 1C:
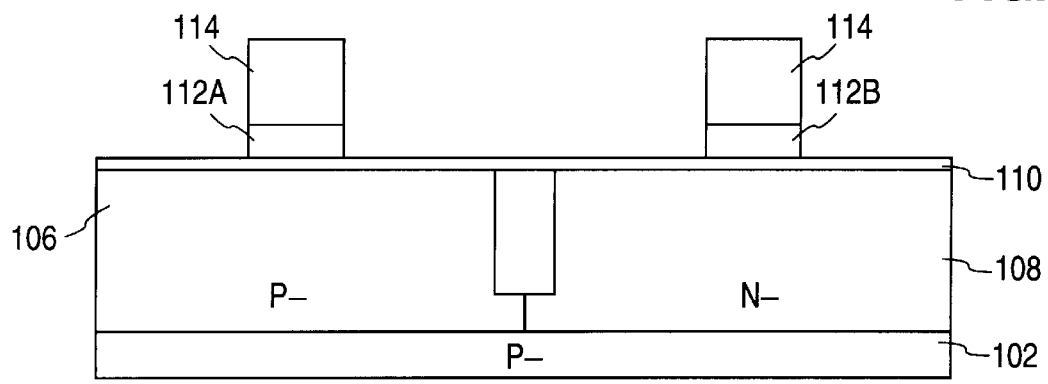
Figure 1D:
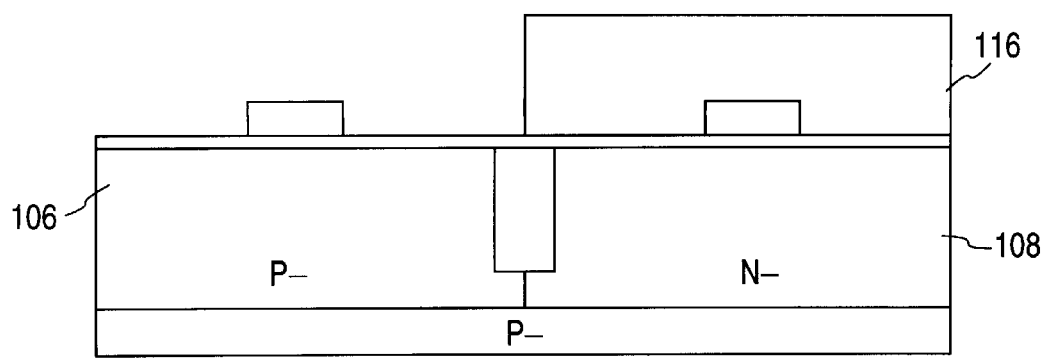
Figure 1E:
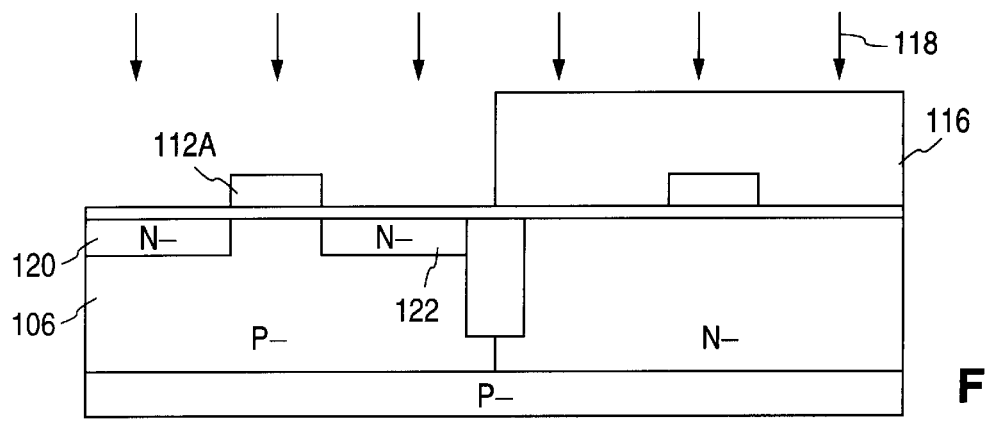
Figure 1F:
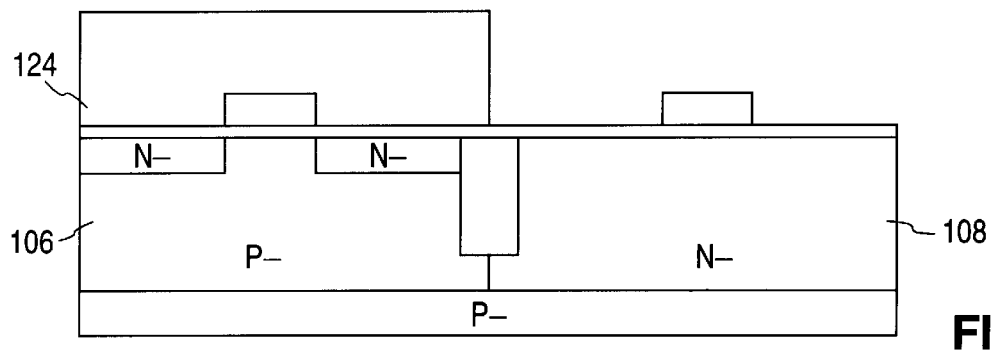
Figure 1G:
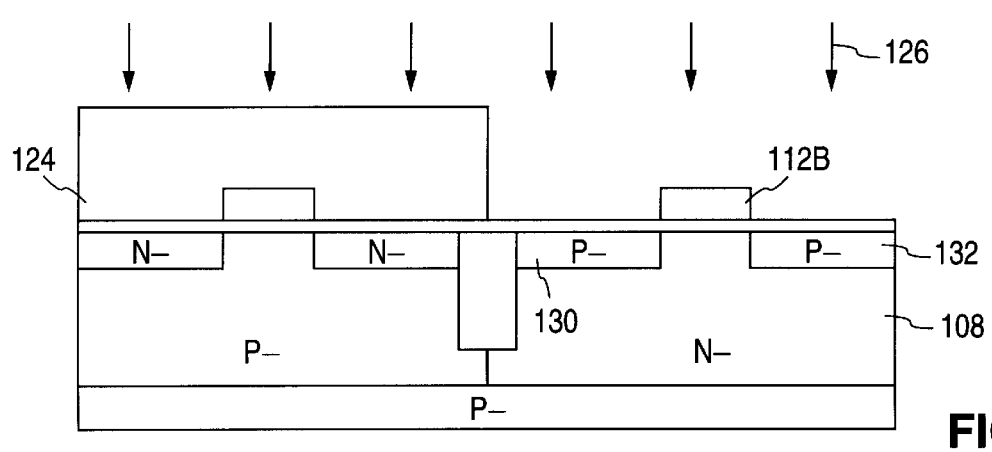
Figure 1H:
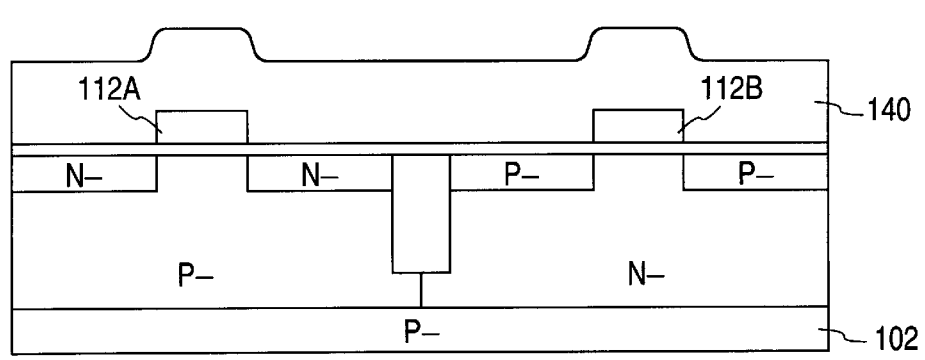
Figure 1I:
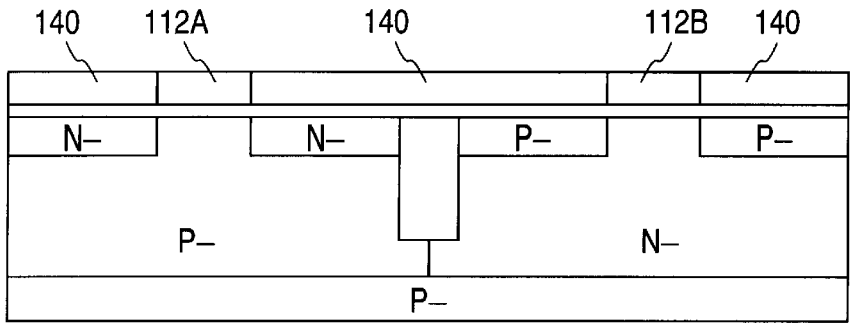
Figure 1J:
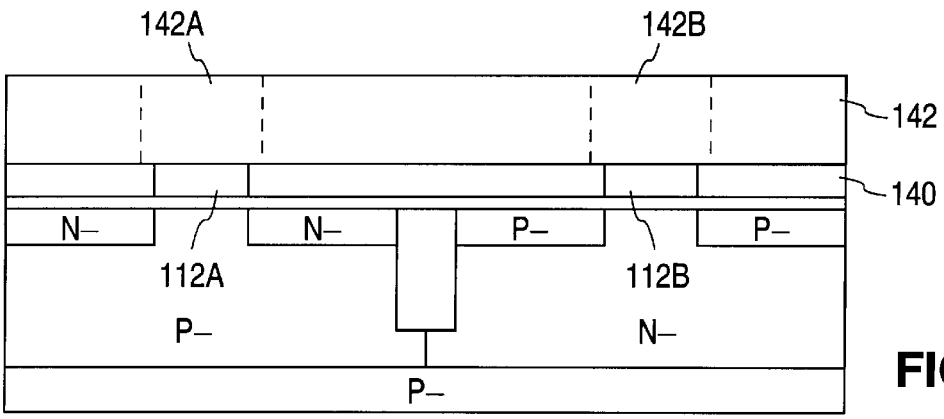
Figure 1K:
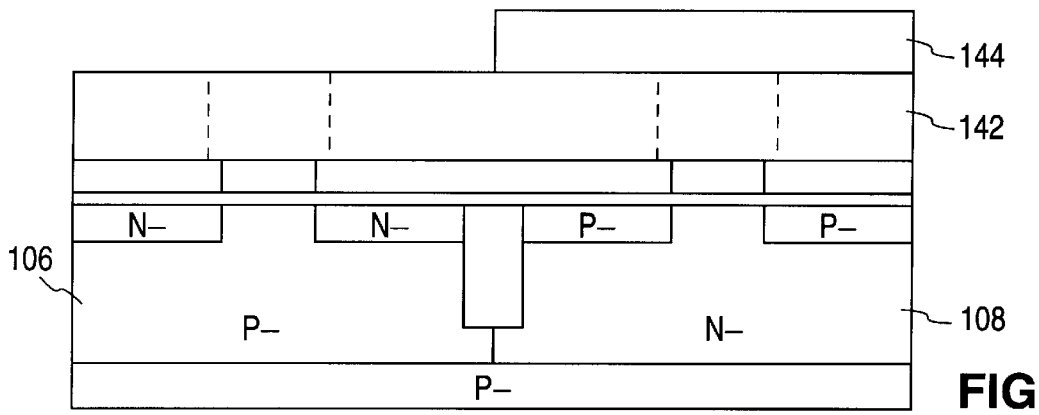
Figure 1L:
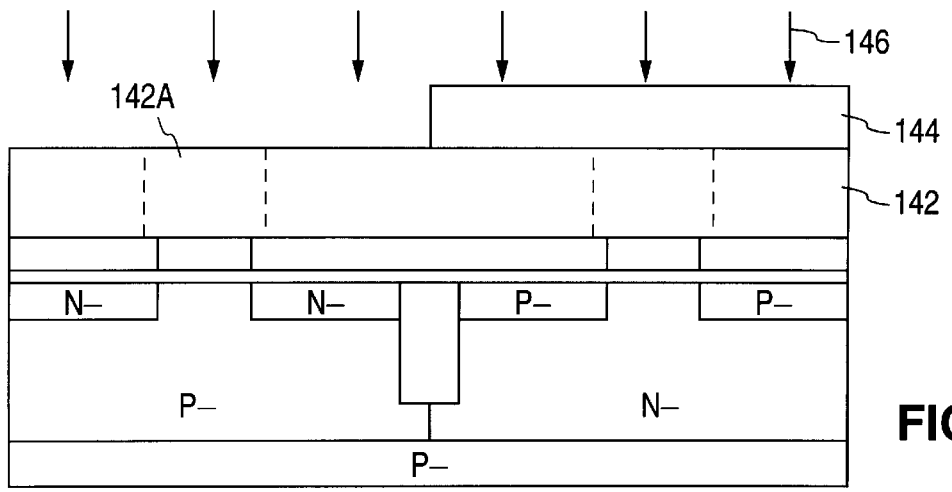
Figure 1M:
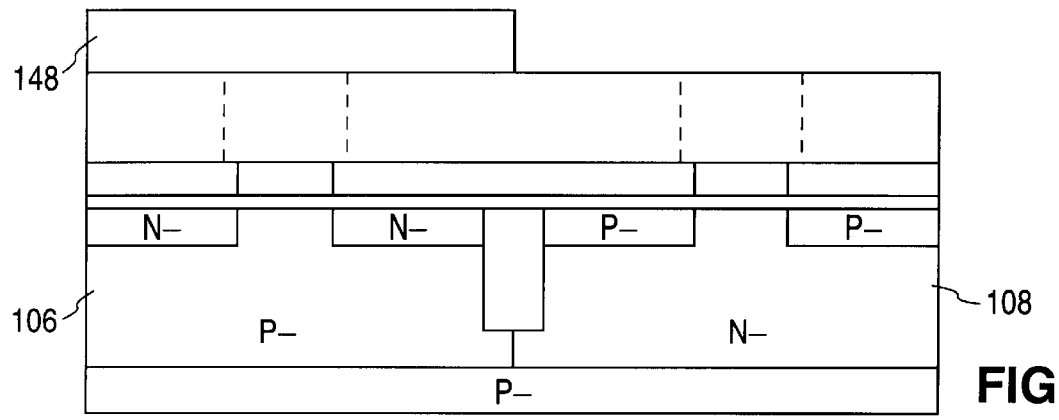
Figure 1N:
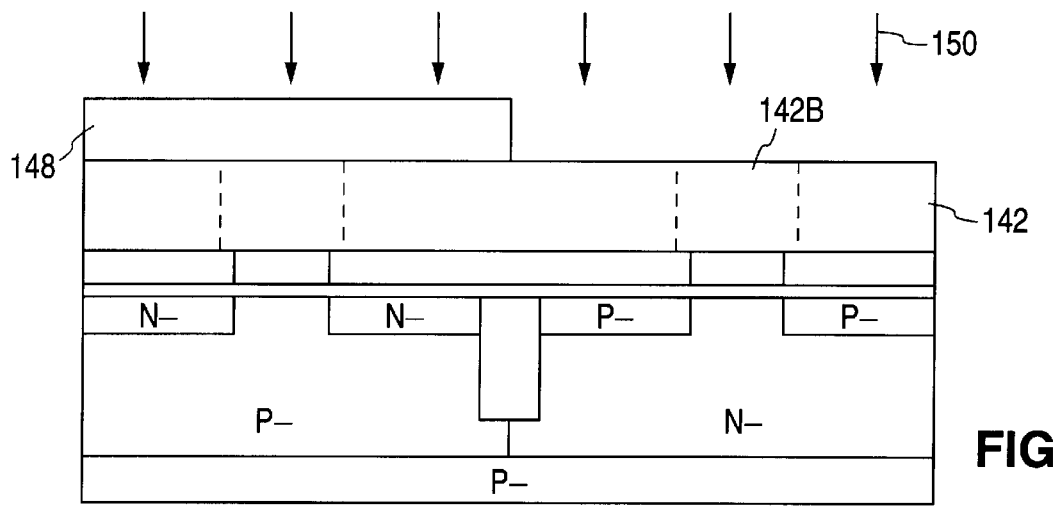
Figure 1O:
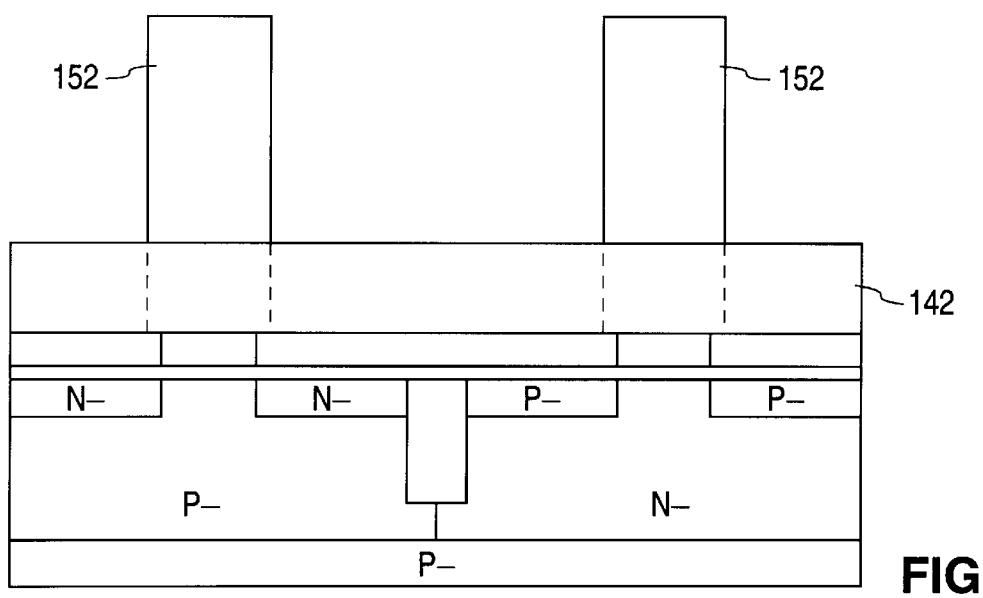
Figure 1P:
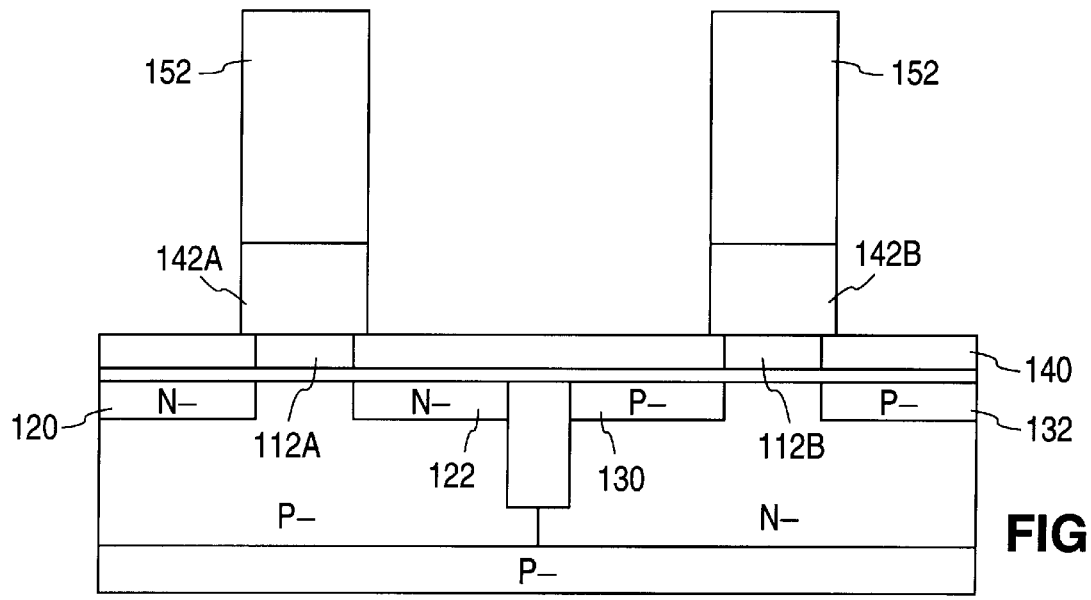
Figure 1Q:
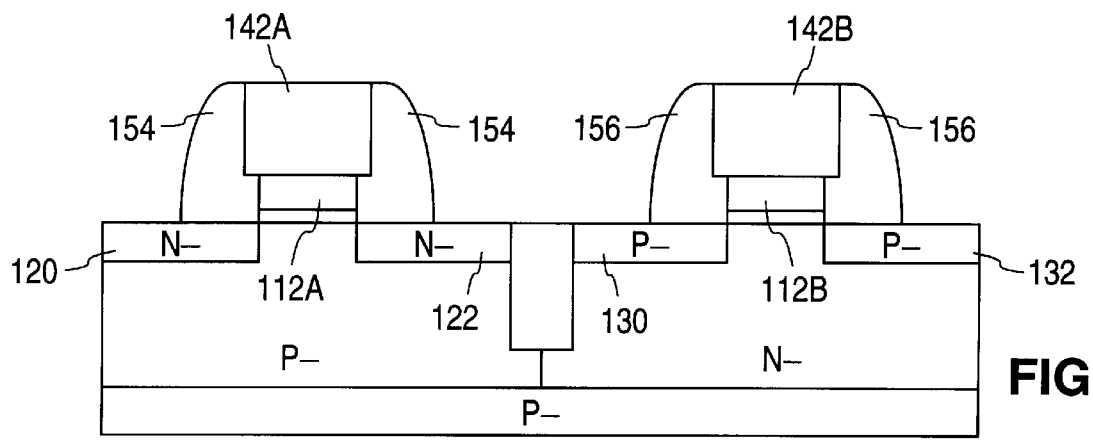
Figure 1R:
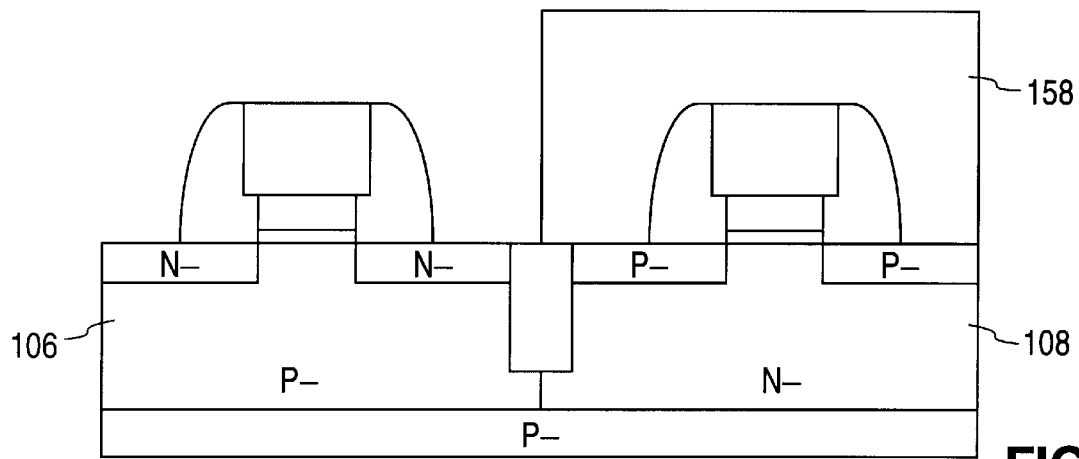
Figure 1S:
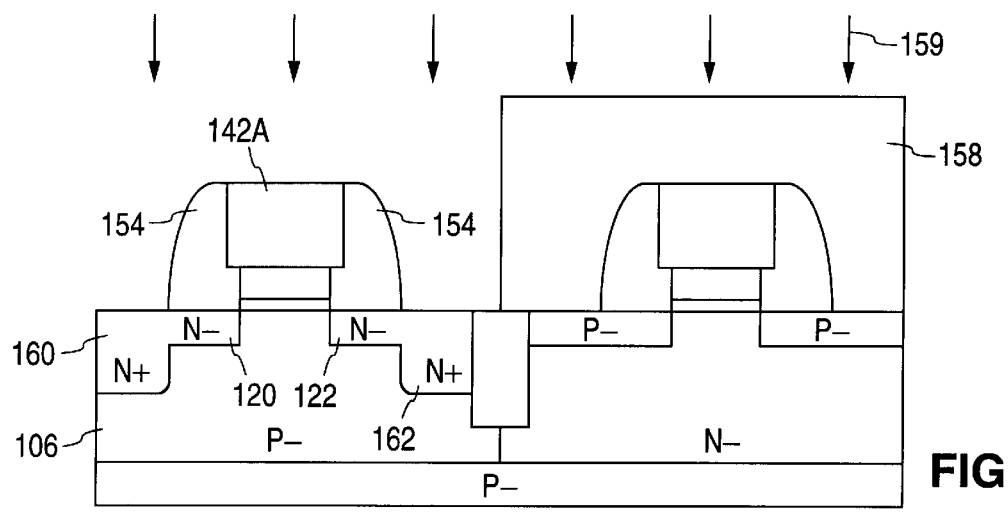
Figure 1T:
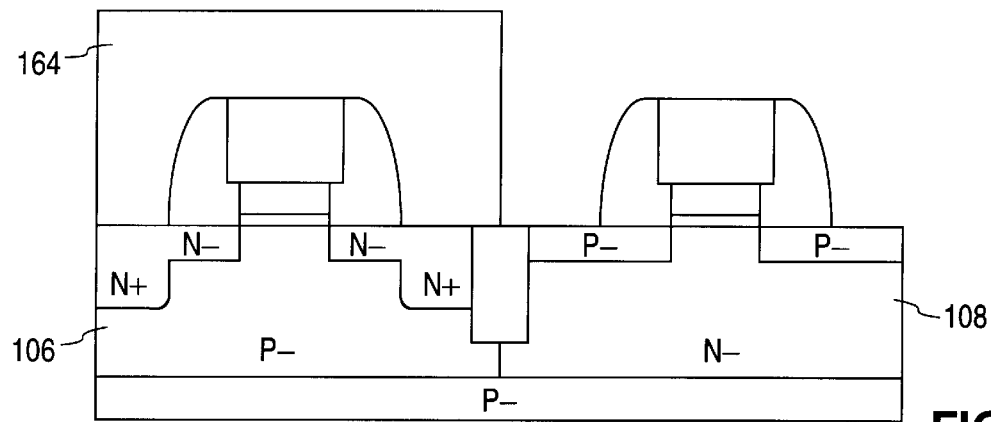
Figure 1U:
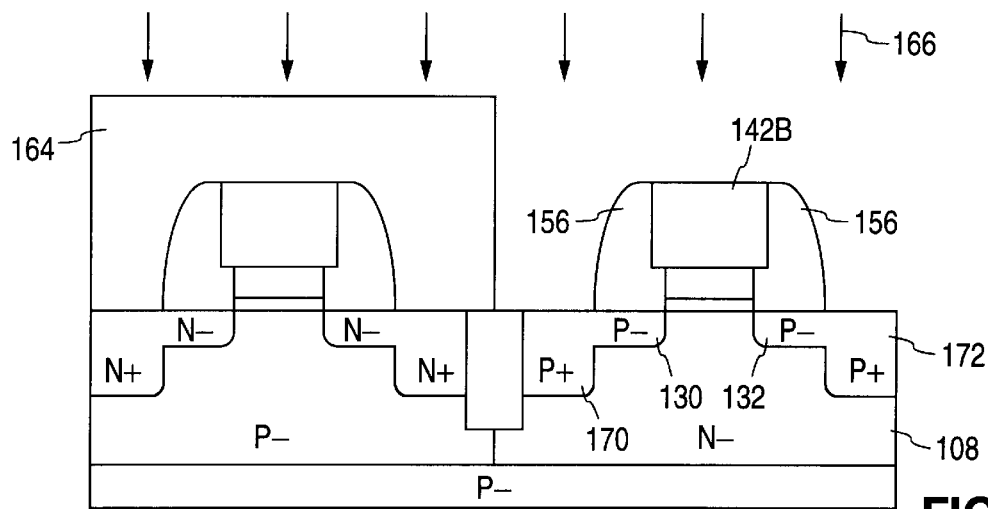
Figure 1V:
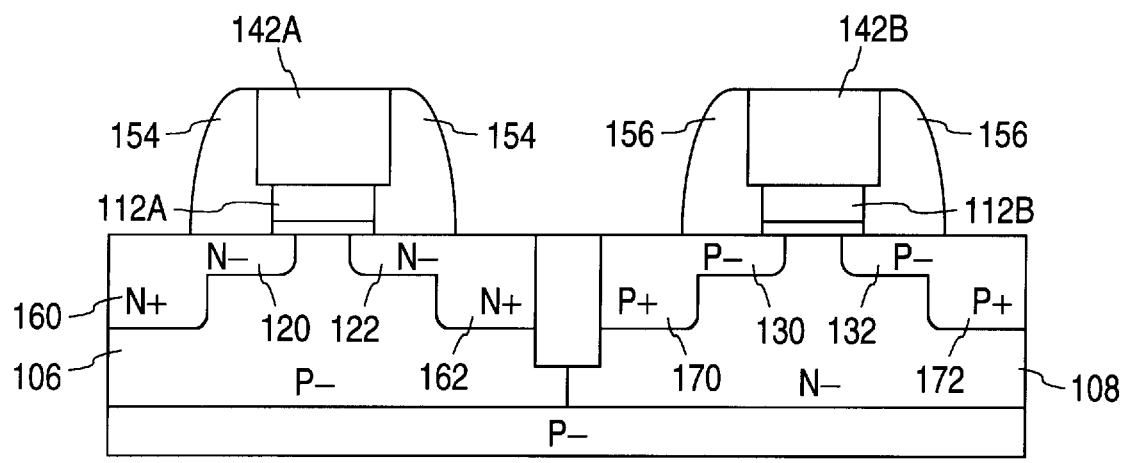

In FIGS. 1A–1V show cross-sectional views of successive process steps for in king an IGFET with a selectively doped multilevel polysilicon gate in accordance with an embodiment of the invention.

In FIG. 1A, silicon substrate 102 suitable for integrated circuit manufacture is provided. Substrate 102 includes a P-type epitaxial surface layer disposed on a P+ base layer (not shown). Substrate 102 contains trench oxide 104 that provides dielectric isolation between P- type NMOS region 106 and N- type PMOS region 108 in the epitaxal surface layer. NMOS region 106 has a boron background concentration on the order of $1\times10^{15}$ atoms /cm$^3$, a <100> orientation and a resistivity of 12 ohm-cm. PMOS region 108 has an arsenic background concentration on the order of $1\times10_{15}$ atoms /cm$^3$, a <100> orientation and a resistivity of 12 ohm-cm. A blanket layer of gate oxide 110, composed of silicon dioxide ($SiO_2$), is formed on the top surface of substrate 102 using tube growth at a temperature of 700° to 1000° C. in an $O_2$ containing ambient. Gate oxide 110 has a thickness in the range of 30 to 100 angstroms. Thereafter, polysilicon layer 112 is deposited by low pressure chemical vapor deposition on the top surface of gate oxide 110. Polysificon layer 112 has a thickness of 500 angstroms. If desired, polysilicon layer 112 can be doped in situ as deposition occurs, or doped immediately after deposition by implanting arsenic with a dosage in the range of $1\times10^{15}$ to $5\times10^{15}$ atoms/cm$^2$ and an energy the range of 2 to 10 kioelectron-volts. However,it is generally preferred that polysilicon layer 112 be initially doped during later processing steps, as described below.

In FIG. 1B, photoresist layer 114 is deposited on polysilicon layer 112. Since polysilicon layer 112 has a thickness of only 500 angstroms, photoresist layer 114 has a thickness of merely 2000 angstroms. A photolithographic system, such as a step and repeat optical projection system which generates deep ultraviolet light from a mercury-vapor lamp, uses a first reticle to irradiate photoresist layer 114 with a first image pattern. Thereafter, the irradiated portions of photoresist layer 114 are removed, and photoresist layer 114 includes openings above selected portions of NMOS region 106 and PMOS region 108. Of importance, photoresist layer 114 is an ultra-thin layer that replicates the first image pattern with a high degree of accuracy.

In FIG. 1C, an anisotropic dry etch is applied using photoresist 114 as an etch mask. Photoresist 114 protects the underlying regions of polysilicon layer 112, and the etch removes the regions of polysilicon layer 112 beneath the openings in photoresist layer 114. The etch is highly selective of polysilicon layer 112 with respect to gate oxide 110, so only a negligible amount of gate oxide 110 is removed and substrate 102 is unaffected. The etch forms polysilicon region 112A of polysilicon layer 112 over NMOS region 106, and polysilicon region 112B of polysilicon layer 112 over PMOS region 108. Polysilicon region 112A includes opposing vertical edges separated by a length of 3500 angstroms, and polysilicon region 112B includes opposing vertical edges separated by a length of 3500 angstroms. Polysilicon regions 112A and 112B form lower gate levels of multilevel polysilicon gates to be formed over NMOS region 106 and PMOS region 108, respectively.

In FIG. 1D, photoresist layer 114 is stripped, and photoresist layer 116 is deposited over NMOS region 106 and PMOS region 108. The photolithographic system uses a second reticle to irradiate photoresist layer 116 with a second image pattern Thereafter, the irradiated portions of photoresist layer 116 are removed, and photoresist layer 116 covers the entire PMOS region 108 and includes an opening above the entire NMOS region 106.

In FIG. 1E, lightly doped source and drain regions are implanted into NMOS region 106 by subjecting the structure to ion implantation of arsenic, indicated by arrows 118, at a dose in the range of $1\times10^{13}$ to $5\times10^{14}$ atoms/cm$^2$ and an energy in the range of 2 to 10 kiloelectron-volts, using polysilicon region 112A and photoresist 116 as an implant mask. As a result, lightly doped source/drain regions 120 and 122 are implanted in NMOS region 106 and are self-aligned to the opposing vertical edges of polysilicon region 112A Lightly doped source/drain regions 120 and 122 are doped N- with an arsenic concentration in the range of about $1\times10^{17}$ to $1\times10^{18}$ atoms/cm$^3$ and a depth in the range of 100 to 300 angstroms.

In FIG. 1F, photoresist layer 116 is stripped, and photoresist layer 124 is deposited over NMOS region 106 and PMOS region 108. The photolithographic system uses a third reticle to irradiate photoresist layer 124 with a third image pattern. Thereafter, the irradiated portions of photoresist layer 124 are removed, and photoresist layer 124 covers the entire NMOS region 106 and includes an opening above the entire PMOS region 108.

In FIG. 1G, lightly doped source and drain regions are implanted into PMOS region 108 by subjecting the structure to ion implantation of boron, indicated by arrows 126, at a dose in the range of $1 \times 10^{13}$ to $5 \times 10^{14}$ atoms/cm$^2$ and an energy in the range of 2 to 10 kiloelectron-volts using polysilicon region 112B and photoresist layer 124 as an implant mask. As a result, lightly doped source/drain regions 130 and 132 are implanted in PMOS region 108 and are self-aligned to the opposing vertical edges of polysilicon region 112B. Lightly doped source/drain regions 130 and 132 are doped P- with a boron concentration in the range of about $1 \times 10^{17}$ to $1 \times 10^{18}$ atoms/cm$^3$ and a depth in the range of 100 to 300 angstroms.

In FIG. 1H, photoresist layer 124 is stripped, and a blanket layer of silicon dioxide is deposited by plasma enhanced chemical vapor deposition at a temperature in the range of 300 to 450° C. to form oxide layer 140 over substrate 102. Oxide layer 140 has a thickness of 1000 angstroms and covers polysilicon regions 112A and 112B.

In FIG. 1I, the structure is planarized by applying chemical-mechanical polishing in the presence of an abrasive slurry that is highly selective of silicon dioxide with respect to polysilicon. The polishing grinds down oxide layer 140, and is discontinued using polysilicon regions 112A and 112B as a stop-layer. After polishing occurs, the top surfaces of polysilicon regions 112A and 112B and oxide layer 140 are exposed and aligned with one another and form a planar surface.

In FIG. 1J, polysilicon layer 142 is deposited by low pressure chemical vapor deposition on the top surfaces of polysilicon regions 112A and 112B and oxide layer 140. Polysilicon layer 142 is undoped and has a thickness of 2000 angstroms. Polysilicon layer 142 includes polysilicon region 142A (with the boundaries shown as broken lines) on polysilicon region 112A, and polysilicon region 142B (with the boundaries shown as broken lines) on polysilicon region 112B.

In FIG. 1K, photoresist layer 144 is deposited over NMOS region 106 and PMOS region 108. The photolithographic system uses the second reticle to irradiate photoresist layer 144 with the second image pattern. Thereafter, the irradiated portions of photoresist layer 144 are removed, and photoresist layer 144 covers the entire PMOS region 108 and includes an opening above the entire NMOS region 106.

In FIG. 1L, polysilicon region 142A is doped by subjecting the structure to ion implantation of arsenic, indicated by arrows 146, at a dosage in the range of $1 \times 10^{15}$ to $5 \times 10^{15}$ atoms/cm$^2$ and an energy in the range of 10 to 50 kiloelectron-volts, using polysilicon layer 142 and photoresist layer 144 as an implant mask.

In FIG. 1M, photoresist layer 144 is stripped, and photoresist layer 148 is deposited over NMOS region 106 and PMOS region 108. The photolithographic system uses the third reticle to irradiate photoresist layer 148 with the third image pattern. Thereafter, the irradiated portions of photoresist layer 148 are removed, and photoresist layer 148 covers the entire NMOS region 106 and includes an opening above the entire PMOS region 108.

In FIG. 1N, polysilicon region 142B is doped by subjecting the structure to ion implantation of boron, indicated by arrows 150, at a dosage in the range of $1 \times 10^{15}$ to $5 \times 10^{15}$ atoms/cm$^2$ and an energy in the range of 10 to 50 kiloelectron-volts, using polysilicon layer 142 and photoresist layer 148 as an implant mask.

In FIG. 1O, photoresist layer 148 is stripped, and photoresist layer 152 is deposited on polysilicon layer 142. Since polysilicon layer 142 has a thickness of 2000 angstroms, photoresist layer 152 has a thickness of 8000 angstroms. The photolithographic system uses the first reticle to irradiate photoresist layer 152 with the first image pattern. Thereafter, the irradiated portions of photoresist layer 152 are removed, and photoresist layer 152 includes openings above selected portions of the active region. Of importance, photoresist layer 152 is relatively thick and fails to replicate the first image pattern with as a high degree of accuracy as did photoresist layer 114.

In FIG. 1P, an anisotropic dry etch is applied using photoresist layer 152 as an etch mask. Photoresist layer 152 protects polysilicon regions 142A and 142B, and the etch removes the regions of polysilicon layer 142 beneath the openings in photoresist layer 152. The etch is highly selective of polysilicon layer 142 with respect to oxide layer 140, so only a negligible amount of oxide layer 140 is removed. After etching occurs, polysilicon region 142A includes opposing vertical edges separated by a length of 3700 angstroms, has a height (or thickness) of 2000 angstroms, and is disposed on polysilicon region 112A. Similarly, polysilicon region 142B includes opposing vertical edges separated by a length of 3700 angstroms, has a height (or thickness) of 2000 angstroms, and is disposed on polysilicon region 112B.

Thus, a first multilevel polysilicon gate consists of polysilicon region 112A as the lower gate level and polysilicon region 142A as the upper gate level, and a second multilevel polysilicon gate consists of polysilicon region 112B as the lower gate level and polysilicon region 142B as the upper gate level. The lengths (or critical dimensions) of polysilicon regions 112A and 112B differ from those of polysilicon regions 142A and 142B due to variations in the abilities of photoresist layers 114 and 142 to accurately replicate the first image pattern. However, lightly doped source/drain regions 120, 122, 130 and 132 are not affected by the relatively inaccurate image pattern replication of photoresist layer 152.

In FIG. 1Q, photoresist layer 152 is stripped, a dry etch is applied that removes gate oxide 110 and oxide layer 140 outside the multilevel polysilicon gates, and another oxide layer with a thickness of 2500 angstroms is conformally deposited over the exposed surfaces by plasma enhanced chemical vapor deposition at a temperature in the range of 300° to 450° C. Thereafter, the structure is subjected to an anisotropic reactive ion etch that forms oxide spacers 154 adjacent to the opposing vertical edges of polysilicon regions 112A and 142A, and oxide spacers 156 adjacent to the opposing vertical edges of polysilicon regions 112B and 142B. Spacers 154 cover portions of lightly doped source/drain regions 120 and 122, and spacers 156 cover portions of lightly doped source/drain regions 130 and 132.

In FIG. 1R, photoresist layer 158 is deposited over NMOS region 106 and PMOS region 108. The photolithographic system uses the second reticle to irradiate photoresist layer 158 with the second image pattern Thereafter, the irradiated portions of photoresist layer 158 are removed, and photoresist layer 158 covers the entire PMOS region 108 and includes an opening above the entire NMOS region 106.

In FIG. 1S, heavily doped source and drain regions are implanted into NMOS region 106 by subjecting the structure to ion implantation of arsenic, indicated by arrows 159, at a dose in the range of $1\times10^{15}$ to $5\times10^{15}$ atoms/cm$^2$ and an energy in the range of 10 to 80 kiloelectron-volts, using polysilicon region 142A and spacers 154 and photoresist layer 158 as an implant mask. As a result, heavily doped source/drain regions 160 and 162 are implanted in NMOS region 106 and are self-aligned to the outside edges of spacers 154. Heavily doped source/drain regions 160 and 162 are doped N+ with an arsenic concentration in the range of about $1\times10^{18}$ to $1\times10^{20}$ atoms/cm$^3$ and a depth in the range of 300 to 2500 angstroms. Preferably, the depth of heavily doped source/drain regions 160 and 162 exceeds that of lightly doped source/drain regions 120 and 122.

In FIG. 1T, photoresist layer 158 is stripped, and photoresist layer 164 is deposited over NMOS region 106 and PMOS region 108. The photolithographic system uses the third reticle to irradiate photoresist layer 164 with the third image pattern. Thereafter, the irradiated portions of photoresist layer 164 are removed, and photoresist layer 164 covers the entire NMOS region 106 and includes an opening above the entire PMOS region 108.

In FIG. 1U, heavily doped source and drain regions are implanted into the PMOS region 108 by subjecting the structure to ion implantation of boron, indicated by arrows 166, at a dose in the range of $1\times10^{15}$ to $5\times10^{15}$ atoms/cm$^2$ and an energy in the range of 10 to 80 kiloelectron-volts, using polysilicon region 142B and spacers 156 and photoresist layer 164 as an implant mask. As a result, heavily doped source/drain regions 170 and 172 are implanted in PMOS region 108 and are self-aligned to the outside edges of spacers 156. Heavily doped source/drain regions 170 and 172 are doped P+ with a boron concentration in the range of about $1\times10^{18}$ to $1\times10^{20}$ atoms/cm$^3$ and a depth in the range of 300 to 2500 angstroms. Preferably, the depth of heavily doped source/drain regions 170 and 172 exceeds that of lightly doped source/drain regions 130 and 132.

In FIG. 1V, photoresist layer 164 is stripped, and the device is annealed to remove crystalline damage and to drive-in and activate the implanted dopants by applying a rapid thermal anneal on the order of 950° to 1050° C. for 10 to 30 seconds. Arsenic in polysilicon region 142A diffuses into polysilicon region 112A to provide most of the doping for polysilicon region 112A, and boron in polysilicon region 142B diffuses into polysilicon region 112B to provide most of the doping for polysilicon region 112B. Furthermore, source regions 120 and 160 form a source and drain regions 122 and 162 form a drain for an NMOS device in NMOS region 106, and source regions 130 and 170 form a source and drain regions 132 and 172 form a drain for a PMOS device in PMOS region 108. Since the source/drain regions diffuse both vertically and laterally, lightly doped regions 120 and 122 extend slightly beneath polysilicon region 112A, lightly doped regions 130 and 132 extend slightly beneath polysilicon region 112B, heavily doped regions 160 and 162 extend partially beneath spacers 154, and heavily doped regions 170 and 172 extend partially beneath spacers 156.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

Of importance, the implantation steps in FIGS. 1L and 1N do not provide source/drain doping, but do selectively increase the doping concentration of polysilicon regions 142A and 142B so that after a subsequent anneal step, polysilicon regions 112A and 112B have well-controlled doping concentrations that provide the desired threshold voltages for the respective NMOS and PMOS devices.

If desired, the multilevel polysilicon gates can be electrically coupled to one another so that the NMOS and PMOS devices provide a CMOS inverter circuit. For instance, upper polysilicon regions 142A and 142B can be part of a continuous polysilicon strip that interconnects otherwise disconnected polysilicon regions 112A and 112B.

The present invention includes numerous variations to the embodiments described above. For instance, the masking layer that defines the lower polysilicon gate levels can be used as an implant mask when the lightly doped source/drain regions are implanted. See, for instance, U.S. application serial no. [unassigned, attorney docket no. M-3990 US] filed concurrently herewith, entitled "Method of Making NMOS and PMOS Devices with Reduced Masking Steps" by Hause et al., which is incorporated by reference. As another alternative, the lightly doped source and drain regions can be implanted using the upper polysilicon gate levels as an implant mask, particularly if ultra-thin photoresist layers provide etch masks for the lower and upper polysilicon gate levels. The dopants can be diffused from the upper polysilicon gate levels into the lower polysilicon gate levels either before or after etching the upper polysilicon layer.

The gate insulator, spacers, and insulating layer can be various dielectrics such as silicon dioxide, silicon nitride and silicon oxynitride. The insulating layer can also be spin-on glass. The active regions can be isolated using various techniques such as LOCOS oxidation. The conductivities of the active regions and implanted dopants can be reversed. Suitable N-type dopants include arsenic and phosphorus; suitable P-type dopants include boron $B_{10}$, boron $B_{11}$, and $BF_x$ species such as $BF_2$.

The invention is particularly well-suited for fabricating N-channel MOSFETs, P-channel MOSFETs and other types of IGFETs, particularly for high-performance microprocessors where high circuit density is essential. Although a single pair of N-channel and P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those sided in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET with a selectively doped multilevel polysilicon gate, comprising the steps of:

providing a semiconductor substrate with an active region;

forming a gate insulator on the active region;

forming a lower polysilicon layer on the gate insulator;

forming a first masking layer over the lower polysilicon layer;

etching the lower polysilicon layer through openings in the first masking layer using the first masking layer as an etch mask for a portion of the lower polysilicon layer that forms a lower polysilicon gate level over the active region;

removing the first masking layer;

forming an upper polysilicon gate level on the lower polysilicon gate level after removing the first masking layer, wherein the multilevel polysilicon gate includes the upper and lower polysilicon gate levels;

introducing a dopant into the upper polysilicon gate level without introducing the dopant into the substrate;

diffusing the dopant from the upper polysilicon gate level into the lower polysilicon gate level; and forming a source and drain in the active region.

2. The method of claim 1, including:

depositing an insulating layer over the substrate and on the lower polysilicon gate level after removing the first masking layer;

polishing the insulating layer until a top surface of the lower polysilicon gate level is exposed; and then forming the upper polysilicon gate level.

3. The method of claim 1, including:

depositing a upper polysilicon layer over the substrate, wherein a portion of the upper polysilicon layer provides the upper polysilicon gate level;

forming a second masking layer over the upper polysilicon layer after implanting the dopant into the upper polysilicon gate level;

etching the upper polysilicon layer through openings in the second masking layer using the second masking layer as an etch mask for the upper polysilicon gate level; and removing the second masking layer.

4. The method of claim 3, including diffusing the dopant from the upper polysilicon gate level into the lower polysilicon gate level before etching the upper polysilicon layer.

5. The method of claim 3, including diffusing the dopant from the upper polysilicon gate level into the lower polysilicon gate level after etching the upper polysilicon layer.

6. The method of claim 1, wherein forming the source and drain includes implanting lightly doped source and drain regions into the active region using the lower polysilicon gate level as an implant mask.

7. The method of claim 1, wherein forming the source and drain includes implanting lightly doped source and drain regions into the active region using the first masking layer as an implant mask.

8. The method of claim 1, wherein forming the source and drain provides implanting lightly doped source and drain regions into the active region using the upper polysilicon gate level as an implant mask.

9. The method of claim 1, wherein diffusing the dopant from the upper polysilicon gate level into the lower polysilicon gate level provides a majority of doping for the lower polysilicon gate level.

10. The method of claim 1, including diffusing the dopant from the upper polysilicon gate level into the lower polysilicon gate level without diffusing the dopant into the substrate.

11. The method of claim 1, wherein the lower polysilicon gate level has a thickness of at most 1000 angstroms.

12. The method of claim 1, wherein the upper polysilicon gate level has a substantially greater thickness than that of the lower polysilicon gate level.

13. An integrated circuit chip, including an IGFET fabricated in accordance with the method of claim 1.

14. An electronic system including a microprocessor, a memory and a system bus, and further including an IGFET fabricated in accordance with the method of claim 1.

15. A method of making an IGFET with a selectively doped multilevel polysilicon gate, comprising the steps of:

providing a semiconductor substrate with an active region;

forming a gate insulator on the active region;

forming a lower polysilicon layer on the gate insulator;

forming a first photoresist layer over the lower polysilicon layer;

irradiating the first photoresist layer with a first image pattern and removing irradiated portions of the first photoresist layer to provide openings above the active region;

etching the lower polysilicon layer through the openings in the first photoresist layer using the first photoresist layer as an etch mask for a portion of the lower polysilicon layer that forms a lower polysilicon gate level over the active region;

removing the first photoresist layer;

depositing an insulating layer over the substrate and on the lower polysilicon gate level after removing the first photoresist layer;

polishing the insulating layer so that a top surface of the lower polysilicon gate level is exposed;

forming an upper polysilicon layer on the lower polysilicon gate level and the insulating layer after polishing the insulating layer, wherein the upper polysilicon layer includes an upper polysilicon gate level on the lower polysilicon gate level, and the multilevel polysilicon gate includes the upper and lower polysilicon gate levels;

implanting a dopant into the upper polysilicon gate level without implanting the dopant into the substrate;

diffusing the dopant from the upper polysilicon gate level into the lower polysilicon gate level without diffusing the dopant into the substrate; and forming a source and drain in the active region.

16. The method of claim 15, including:

forming a second photoresist layer over the upper polysilicon layer;

irradiating the second photoresist layer with a second image pattern and removing irradiated portions of the second photoresist layer to provide openings above the active region;

etching the upper polysilicon layer through the openings in the second photoresist layer using the second photoresist layer as an etch mask for the upper polysilicon gate level; and removing the second photoresist layer.

17. The method of claim 16, wherein:

the second polysilicon layer has a substantially greater thickness than that of the first polysilicon layer; and the second photoresist layer has a substantially greater thickness than that of the first photoresist layer.

18. The method of claim 17, wherein the first and second image patterns are essentially identical.

19. The method of claim 17, including diffusing the dopant from the upper polysilicon gate level into the lower polysilicon gate level before etching the upper polysilicon layer.

20. The method of claim 17, including diffusing the dopant from the upper polysilicon gate level into the lower polysilicon gate level after etching the upper polysilicon layer.

21. The method of claim 17, wherein diffusing the dopant from the upper polysilicon gate level into the lower polysilicon gate level provides a majority of doping for the lower polysilicon gate level.

22. The method of claim 17, including forming the upper polysilicon layer on substantially aligned top surfaces of the lower polysilicon gate level and the insulating layer.

23. The method of claim 17, wherein the lower polysilicon gate level has a thickness of at most 1000 angstroms.

24. The method of claim 17, wherein the multilevel polysilicon gate consists of the upper and lower polysilicon gate levels.

25. A method of making first and second IGFETs with selectively doped multilevel polysilicon gates, comprising the steps of:

providing a semiconductor substrate with first and second active regions;

forming a gate insulator on the active regions;

depositing a lower polysilicon layer on the gate insulator; forming a first photoresist layer over the lower polysilicon layer;

irradiating the first photoresist layer with a first image pattern and removing irradiated portions of the first photoresist layer to provide openings above portions of the active regions;

etching the lower polysilicon layer through the openings in the first photoresist layer using the first photoresist layer as an etch mask for portions of the lower polysilicon layer that form a first lower polysilicon gate level over the first active region and a second lower polysilicon gate level over the second active region;

removing the first photoresist layer;

depositing an insulating layer over the substrate and on the first and second lower polysilicon gate levels after removing the first photoresist layer;

polishing the insulating layer so that top surfaces of the first and second lower polysilicon gate levels are exposed;

depositing an upper polysilicon layer on the first and second lower polysilicon gate levels and the insulating layer after polishing the insulating layer, wherein the upper polysilicon layer includes a first upper polysilicon gate level on the first lower polysilicon gate level and a second upper polysilicon gate level on the second lower polysilicon gate level, a first multilevel polysilicon gate includes the first upper and lower polysilicon gate levels, and a second multilevel polysilicon gate includes the second upper and lower polysilicon gate levels;

implanting a first dopant into the first upper polysilicon gate level without implanting the first dopant into the substrate;

diffusing the first dopant from the first upper polysilicon gate level into the first lower polysilicon gate level without diffusing the dopant into the substrate;

forming a first source and first drain in the first active region; and forming a second source and second drain in the second active region.

26. The method of claim 25, wherein:

the first and second active regions are of first conductivity type; and the first and second sources and drains and the first dopant are of second conductivity type.

27. The method of claim 26, including:

simultaneously implanting the first dopant into the first and second upper polysilicon levels; and simultaneously diffusing the first dopant from the first upper polysilicon gate level into the first lower polysilicon gate level and from the second upper polysilicon gate level into the second lower polysilicon gate level.

28. The method of claim 25, wherein:

the first active region and the second source and second drain are of first conductivity type; and the second active region and the first dopant and the first source and first drain are of second conductivity type.

29. The method of claim 28, including:

implanting the first dopant into the first upper polysilicon gate level without implanting the first dopant into the second upper polysilicon gate-level;

implanting a second dopant of first conductivity type into the second upper polysilicon gate level without implanting the second dopant into the first upper polysilicon gate level; and simultaneously diffusing the first dopant from the first upper polysilicon gate level into the lower polysilicon gate level and the second dopant from the second upper polysilicon gate level into the second lower polysilicon gate level.

30. The method of claim 25, including:

forming a second photoresist layer over the upper polysilicon layer after implanting the first dopant;

irradiating the second photoresist layer with the first image pattern and removing irradiated portions of the second photoresist layer to provide openings above portions of the active regions;

etching the upper polysilicon layer through the openings in the second photoresist layer using the second photoresist layer as an etch mask for the first and second upper polysilicon gate levels; and removing the second photoresist layer.

31. The method of claim 25, wherein diffusing the first dopant from the first upper polysilicon gate level into the first lower polysilicon gate level provides a majority of doping for the first lower polysilicon gate level.

32. The method of claim 25, including forming the upper polysilicon layer on substantially aligned top planar surfaces of the first lower polysilicon gate level, the second lower polysilicon gate level and the insulating layer.

33. The method of claim 25, wherein the first and second lower polysilicon gate levels have a thickness of at most 1000 angstroms.

34. The method of claim 25, wherein the first and second lower polysilicon gate levels have a thickness in the range of 500 to 1000 angstroms.

35. The method of claim 25, wherein the first and second upper polysilicon gate levels have a substantially greater thickness than that of the first and second lower polysilicon gate levels.

* * * * *